United States Patent
Birx et al.

(10) Patent No.: US 6,728,284 B1
(45) Date of Patent: Apr. 27, 2004

(54) HIGH POWER SOLID STATE LASER MODULATOR

(75) Inventors: Daniel L. Birx, Oakley, CA (US); Don G. Ball, Livermore, CA (US); Edward G. Cook, Livermore, CA (US)

(73) Assignee: The United States of America as represented by the United States Department of Energy, Washington, DC (US)

( * ) Notice: Subject to any disclaimer, the term of this patent is extended or adjusted under 35 U.S.C. 154(b) by 1,826 days.

(21) Appl. No.: 08/079,177

(22) Filed: Jun. 8, 1993

(51) Int. Cl.[7] ............................. H03K 3/00; H01J 3/10; G11C 13/02
(52) U.S. Cl. .............................. 372/82; 359/345
(58) Field of Search ................ 372/82; 359/345; 307/419, 106, 107, 415; 328/65, 67

(56) References Cited

U.S. PATENT DOCUMENTS

| | | | |
|---|---|---|---|
| 4,275,317 A | | 6/1981 | Laudenslager et al. ..... 307/415 |
| 4,698,518 A | | 10/1987 | Pacala ..................... 307/106 |
| 4,811,188 A | * | 3/1989 | Bees ........................ 363/28 |
| 4,908,524 A | * | 3/1990 | Sojka ....................... 307/107 |
| 4,928,020 A | * | 5/1990 | Birx et al. ................. 307/106 |
| 4,996,495 A | * | 2/1991 | Birx ......................... 328/65 |
| 5,124,629 A | * | 6/1992 | Ball et al. .................. 323/268 |
| 5,142,166 A | * | 8/1992 | Birx ......................... 307/419 |
| 5,177,754 A | * | 1/1993 | Ball et al. .................. 372/38 |
| 5,189,678 A | * | 2/1993 | Ball et al. .................. 372/28 |
| 5,202,894 A | * | 4/1993 | Chaudanson ............... 372/38 |

OTHER PUBLICATIONS

E.G. Cook et al., "High Average Power Magnetic Modulator for Copper Lasers" UCRL–JC–105816, Lawrence Livermore National Laboratory, Jun. 14, 1991.
W. S. Melville, "The Use of Saturable Reactors as Discharge Devices for Pulse Generators", Paper No. 1034 Radio Section pp. 185–207.

* cited by examiner

Primary Examiner—Nelson Moskowitz
(74) Attorney, Agent, or Firm—William C. Daubenspeck; Paul A. Gottlieb

(57) ABSTRACT

A multi-stage magnetic modulator provides a pulse train of ±40 kV electrical pulses at a 5–7 kHz repetition rate to a metal vapor laser. A fractional turn transformer steps up the voltage by a factor of 80 to 1 and magnetic pulse compression is used to reduce the pulse width of the pulse train. The transformer is fabricated utilizing a rod and plate stack type of construction to achieve a high packing factor. The pulses are controlled by an SCR stack where a plurality of SCRs are electrically connected in parallel, each SCR electrically connected to a saturable inductor, all saturable inductors being wound on the same core of magnetic material for enhanced power handling characteristics.

11 Claims, 8 Drawing Sheets

HIGH POWER SOLID STATE LASER MODULATOR

STATEMENT AS TO RIGHTS OF INVENTION

The United States Government has rights in this invention pursuant to contract No. W-7 40 5-ENG-4 8 between the United States Department of Energy and the University of California for the operation of the Lawrence Livermore National Laboratory.

BACKGROUND OF THE INVENTION

1. Field of the Invention

The present invention relates to a high average power magnetic modulator for metal vapor lasers and the like.

2. Description of the Related Art

Many different types of lasers are energized by pulsed electrical discharges. Where higher average output power is desired from a pulsed laser system, more power per pulse, shorter pulse lengths and less time between pulses is generally required. Extensive experience with thyratron driven capacitor inversion circuits for driving moderate power metal vapor lasers such as copper vapor lasers (about 10 kW input) teaches that in such circuits the thyratrons do not exhibit the lifetime required for the new higher power output copper vapor lasers. The operating constraints that moderate power modulators impose on a thyratron with regard to di/dt, peak current amplitudes, and repetition rates often cause premature thyratron failure due to cathode depletion, gas depletion, and anode erosion; a significant increase in the power switched by the thyratron would only exacerbate this problem. An examination of other known types of high voltage modulator switches, technologies, and circuit topologies has not revealed a simple, inexpensive, or proven alternative. The search for longer lifetimes has led to the use of magnetic compression circuits even though they are a more complex and more expensive technological approach as compared with thyratron switched capacitor inversion circuits. While the use of magnetic compression circuits reduces the electrical stress on the thyratrons (often used as the primary switching device) and thereby increases the thyratrons' operating lifetime, experience with such systems still indicates insufficient thyratron lifetime. Although thyratrons are designed as high peak power, high repetition rate commutation devices, thyratrons by their construction are plasma devices and have infinite lifetimes due to gas cleanup, cathode depletion and filament lifetime limits. This leads to the conclusion that other types of commutation switches must be used in conjunction with magnetic compression circuits to achieve the required power levels, reliabilities and lifetimes.

In an attempt to overcome the short device lifetimes and other limitations of thyratron driven modulators, solid state devices such as thyristors and Silicon Controlled Rectifiers (SCRs) have been used in the past as commutators in magnetic compression circuits for driving high power lasers. Such solid state devices have a potentially very long lifetime (more than tens of thousands of hours) if their performance ratings are not exceeded. However, solid state switches are relatively slow devices (conduction times are usually in the tens of microseconds and longer as compared with thyratrons that can have conduction times measured in tens of nanoseconds and longer) designed for high average power but not capable of switching high peak power. Accordingly, they must be coupled with a magnetic compression circuit in order to drive high peak power loads such as a gas discharge load.

Solid state devices are low voltage devices; most of the high average power devices designed for short conduction times (inverter grade devices) have maximum voltage ratings of less than 1500 volts. Consequently, to drive high voltage loads, solid state devices have to be stacked in series to increase the overall switching voltage and/or a step-up pulse transformer must be incorporated into the modulator circuit. If devices are not stacked in series, several devices operating in parallel are usually required and a very high step-up ratio, pulse transformer is required. Either series operation or parallel operation of solid state devices have both advantages and disadvantages.

A series stack can be designed to be equivalent to a thyratron in voltage rating and can replace the thryatron in a magnetic compression circuit if the switch conduction time is long enough; thyristors and SCRs do not switch or turn on as fast as thyratrons and cannot handle large rates of change in current (the maximum di/dt for most available devices is less than 1000 amperes per microsecond). The advantages of a series stack include: additional devices can be used to provide redundancy and increase the operating lifetime (one or more devices can fail (short) but the stack and modulator can continue operating); at high voltages the peak current requirements through switches and other components at the modulator input are reduced; and a pulse transformer, if required, will have a lower step-up ratio and low leakage inductance (required for an efficient pulse transformer) will not be difficult to attain. The disadvantages include: a series stack is expensive because, with a safety factor, twenty or more devices (at a 1200 volt rating) are required to make up a 20 kV thyratron replacement; voltage grading and overvoltage protection devices must be placed across every device; devices must be reasonably matched as to turn-on times to insure simultaneous or near simultaneous stack turn-on time (although external devices such as a magnetic assist can alleviate this problem); and individual trigger circuits with high voltage isolation are required for each device.

A switching circuit consisting of parallel solid state devices limits the input voltage of the modulator to the maximum operating voltage of the devices. Advantages of parallel operation include: the number of switching devices decreases as the energy transfer time increases; using few devices reduces the cost and volume; and the devices and their trigger circuits only need circuit isolation for 1 kV. Disadvantages include: a single device failure (short) results in modulator failure; the modulator circuit must be designed to insure current sharing between devices; operation at lower voltages implies high peak and rms currents so capacitors and conductors are required to have small series resistances in order to keep power losses small; and the required high step-up ratio pulse transformer (1:60 to 1:80) with very low leakage inductance can be inexpensive and difficult to manufacture.

Magnetic compression circuits are well-known in the art for having the capability of generating high peak power, short time duration voltage pulses by time compression of energy. Being composed of passive circuit elements (capacitors and non-linear inductors) they are very robust and can be very reliable. In application, magnetic compression circuits usually serve as an interface between a controllable switching device and a power load that usually requires high voltage, high peak power, short time duration, and often high repetition rate pulses. The controllable switching device is usually incapable of driving the load directly with any reasonable reliability or lifetime. The complexity and cost of magnetic compression circuits usually restrict their use to high average power, high repetition rate systems; metal vapor laser systems have these requirements and have utilized magnetic compression circuits. Such pulsed lasers are utilized in many applications such as medical diagnostics, laser isotope separation of an atomic vapor (known as an AVLIS (Atomic Vapor Laser Isotope Separation) process), and many other applications.

The basic principle underlying magnetic pulse compression operation involves a saturable inductor, often referred to as a magnetic switch, which consists of a winding around a saturating magnetic core. In operation, the inductance of the magnetic switch will change from a large value (unsaturated core) to a small value (saturated core) when a voltage is applied across the switch for a specified length of time. The gain of a magnetic switch is defined as the ratio of two time periods; the time that the magnetic switch can hold-off an applied voltage (prior to core saturation) and the time required to transfer energy through the switch (after core saturation). A typical magnetic switch has a gain of between 3 to 10. The resonant circuit consisting of the saturable inductor and two capacitors of approximately equal value that are usually connected between ground and the input and output of saturable inductor is commonly referred to as a stage of compression, a compression stage, or simply, a stage. Typically, the output capacitor of a stage of compression is the input capacitor to the next compression stage. The compression stages are cascaded and energy is coupled faster and faster from one stage to the next (the overall gain of a multistage magnetic modulator is the algebraic product of the gains of the individual stages). Referring to FIG. 1, a typical modulator uses a plurality of stages as shown in order to achieve an effective change in impedance much larger than can be obtained from a single stage. In a conventional magnetic modulator as shown in FIG. 1, capacitor $C_1$ is charged through an inductor $L_0$. When $C_1$ is fully or almost fully charged, saturable inductor $L_1$ saturates. $L_1$ is chosen to have a saturated inductance much less than $L_0$. Once $L_1$ saturates, capacitor $C_2$ will begin to charge from $C_1$ through $L_1$, but because the saturated inductance of $L_1$ is much less than that of saturable inductor $L_0$, capacitor $C_2$ charges much more rapidly than $C_1$ was initially charged. In a lossless circuit, all of the energy in $C_1$ is transferred to $C_2$ provided $C_1$ is equal in value to $C_2$. The process continues through the successive stages until capacitor $C_n$ discharges into the load. Before the pulse compression sequence can be repeated, the magnetic cores of the modulator must be reset. The maximum pulse repetition rate is constrained by the time required for the pulse energy to propagate through the modulator, the recovery time required by the main switch, and the time required to reset the saturable inductors.

Conventional magnetic pulse compression circuits transfer power in both directions. They not only act to increase the pulse frequency in the forward direction thereby providing temporal compression of the pulse, but also decrease the pulse frequency of the voltage pulse as it cascades back through the compression stages in the reverse direction. The energy which reflects back from an impedance mismatch at the laser load (the typical case) can propagate up the chain to the commutator switch.

A disadvantage associated with conventional magnetic compression circuits is, that because they are resonant circuits, residual energy left behind in the circuit after the main drive pulse has passed will lead to oscillations. These low level oscillations may continue on for durations several orders of magnitude longer than the initial compression time and may cause problems in resetting the cores of the saturable reactors to a repeatable reset position, thus causing variations in the saturation time from pulse-to-pulse. This pulse-to-pulse variation produces undesirable or unacceptable pulse-to-pulse timing jitter at the load.

Besides pulse compression, laser modulators are usually called upon to perform voltage step-up as well. In a laser modulator, the pulse transformer usually performs the key function of voltage step-up for impedance matching and/or voltage isolation. Various design constraints must be taken into account when building a high frequency transformer. In particular, leakage inductance, which is inversely proportional to how well the primary and secondary winding are coupled to each other, slows down the risetime of the pulse through the transformer and is detrimental to the modulator efficiency and performance. In a conventional pulse transformer, low leakage inductance is achieved by interleaving the primary and when the goal is also to achieve large voltage differences between the primary and secondary windings. This approach is made more complicated when the goal is also to achieve large voltage differences between the primary and secondary winding. This can result in large and complex structures.

Driving metal vapor lasers such as copper vapor lasers is difficult because the lasing action is a direct result of an electrical discharge through a low pressure buffer gas and presents a highly nonlinear, time-varying load to the modulator. The discharge resistance in such a laser may change several orders of magnitude over the duration of a short (approximately 30–100 nanosecond) drive pulse. In addition, the laser head inductance is large in comparison with the RMS discharge impedance and thus a large fraction of the drive energy ends up stored in this inductance. As a result, high frequency, high voltage oscillations appear at the output of the laser modulator and attempt to couple high frequency energy back into the modulator rather than into the collapsing resistance of the discharge.

In summary there is a need for a long life ($10^{11}$–$10^{12}$ shots) and high reliability (capable of greater than 5000 hours between failures) high power laser modulator. Thyratron driven circuits typically are incapable of meeting these critical performance objectives because they develop discharge instabilities which lead to localized arc formation, electrode erosion, gas depletion and premature device failure. In comparison, solid state devices are capable of very long lifetimes and have no known wearout mechanisms. There is thus a need for an improved solid state switched modulator for efficiently driving high average power metal vapor lasers at high repetition rates and with increased reliability.

SUMMARY OF THE INVENTION

It is an object of the present invention to provide an improved magnetic modulator for high average input power (greater than 30 kW) metal vapor lasers. The magnetic modulator system described herein and shown in schematic form in FIG. 2 utilizes parallel solid state commutation devices, a novel high step-up ratio fractional turn transformer, and three stages of magnetic compression. Other components and sub-circuits critical to its operation are also described.

In accordance with one aspect of the invention, the energy transfer circuit which provides the drive to the first stage of the pulse compression circuits is segmented into a plurality of parallel SCRs or other gate controlled solid state switches, each device connected electrically in common at the anode junction. In addition the cathode of each solid state device is connected to its own saturable inductor commonly referred to as a magnetic assist. To force the saturable inductors to saturate simultaneously, thereby allowing simultaneous current flow in each of the SCRs, all the saturable inductor windings are wound on the same magnetic core. The hold-off time provided by the magnetic assist enables each SCR to turn on more completely prior to current build up which occurs when the magnetic assist saturates, thus reducing the turn-on energy losses in the SCRs. The inductance of the saturable inductor also forces the SCRs to share current, thus preventing damage to an individual SCR due to overcurrent. The magnetic assist is in essence a magnetic switch with a gain of typically 0.2 to 0.3; i.e., the hold-off time of the magnetic assist is less than its energy transfer time. The magnetic assist may be connected to either the cathode junction as shown by the circuit topology in FIG. 2 or in the anode circuit (in which case the cathodes are electrically connected in common), as preferred by the designer or most beneficial for circuit implementation. The terms "magnetically assisted SCR" and "magnetically assisted gate controlled SCR" are intended to refer to both configurations set forth in this paragraph.

In accordance with another aspect of the present invention, a novel fractional turn pulse step-up transformer having a gain of 1:80 is utilized. The fractional turn transformer described herein is defined to have two or more single-turn transformer primary windings electrically connected in parallel and driven by a single source. In addition, a continuous and electrically isolated secondary winding(s) links electromagnetically and simultaneously to all of the parallel primary windings. The total step-up ratio is the product of the number of primary windings times the number of turns in the secondary winding. More than one secondary winding may be employed. This novel transformer has a very low leakage inductance which results in a more compact and efficient modulator structure.

The fractional turn transformer described herein has an extremely low leakage inductance because of the mechanical design which incorporates many parallel, low impedance, transmission line type feeds to the transformer primary windings which in turn completely surround the magnetic core material with wide, tightly coupled (i.e., small spacing between conductors and the magnetic core) conductors. The low leakage inductance reduces the total gain (and therefore the losses) required of the final stages of the modulator. The transformer itself exhibits very low copper (conductor) loss due to the wide primary conductors (which have a very small resistance even at the high frequencies where skin effects may dominate) and low core losses because the core undergoes only a small increment of its total available flux swing.

The transformer secondary winding consists of a plurality of stainless steel tubes connected with bus links at the ends to form one continuous winding. Stainless steel tubing is used as the secondary winding conductor because its high resistivity (compared with aluminum or copper) increases the winding resistance and reduces timing jitter by dampening oscillations which can cause variations in the starting point in flux density when the cores of the saturable inductors are being reset.

In accordance with another aspect of the present invention, a fractional turn step-up transformer having a novel electromechanical geometry is employed as to minimize flux losses and achieve high gain. The novel fractional turn, "1/n", transformer comprises a plurality of "n", primaries. A transformer primary winding consists of a pair of plates which attaches to the top-side and bottom-side of a mandrel on which is wound the magnetic core and a flux shield which is positioned on the outside diameter of the magnetic core. The top plate constitutes the input or drive side of the primary winding, while the return side of the primary winding consists of the bottom plate and the flux shield which is connected electrically to the bottom plate. The primary winding forms a tightly coupled, conducting loop around the magnetic core in that the plates, mandrel, and flux shield completely surround the core (usually toroidal) with small spacings on all sides. However, the input and return side of the primary winding must not touch. The plurality of transformer primary windings are stacked vertically on their common axis. Electrical connections to both the drive plates and the returns of the primary windings are made in a very low inductance manner such that each of the primary windings may be considered to be driven equally by the drive source. It is essential that the primary winding be physically very close to the magnetic core in order to minimize magnetic flux outside the magnetic core (stray flux). In addition, the secondary winding must couple (enclose) all the flux generated by current flow in the primary winding in order to achieve very low leakage inductance.

The secondary winding of the transformer is comprised of stainless steel tubes installed on a diameter smaller than that of the magnetic core (on transformer primary) and connected on each end with a bus link to adjacent stainless steel tubes installed on a diameter larger than that of the magnetic core. The rods extend vertically through the plurality of stacked primaries. The rods on the smaller diameter and larger diameter are connected thusly together such that they form a single electrically continuous winding which loops around the magnetic cores of all the primaries. To maintain the low leakage inductance, the tubes of the secondary winding pass through holes in the transformer mandrels, the drive and return plates, and the flux shields and are therefore completely isolated from the primary-windings. The secondary output voltage appears across the ends of the winding.

In accordance with another aspect of the present invention, energy from the reverse current due to the impedance mismatch at the laser load is recovered and utilized to recharge the intermediate storage capacitor. This novel process results in energy savings and thus increased overall operating efficiency.

In accordance with another aspect of the present invention and with respect to the pulsed voltage, the laser head is allowed to float with respect to earth ground. That is, opposite electrodes of the laser head are pulsed at, for example, +35 kV and −35 kV, respectively. Floating the output in this manner enables the size of the transformer to be reduced and also substantially reduces much of the electrical stress within the transformer.

In accordance with another aspect of the invention, increased efficiency is provided by grading the storage capacitors of each pulse compression stage so that they gradually increase in capacitance in the direction of the output. This provides maximum energy transfer from one stage of compression to the next. Without the grading of capacitors, energy losses due to the magnetic switch and resistive losses in conductors and capacitors will result in some energy being left on the magnetic switch's input capacitor after the energy transfer has taken place.

Additional objects, advantages and novel features of the present invention will be set forth in part in the description which follows and in part become apparent to those skilled

BRIEF DESCRIPTION OF THE DRAWINGS

FIG. 5b is a perspective cross-sectional view of the second stage taken along line A—A of FIG. 5a.

DETAILED DESCRIPTION OF PREFERRED EMBODIMENTS

A solid state laser modulator according to a preferred embodiment of the present invention is used to provide high voltage, high current drive pulses to a large bore copper vapor laser amplifier for the generation of a population inversion therein.

Figure 1:
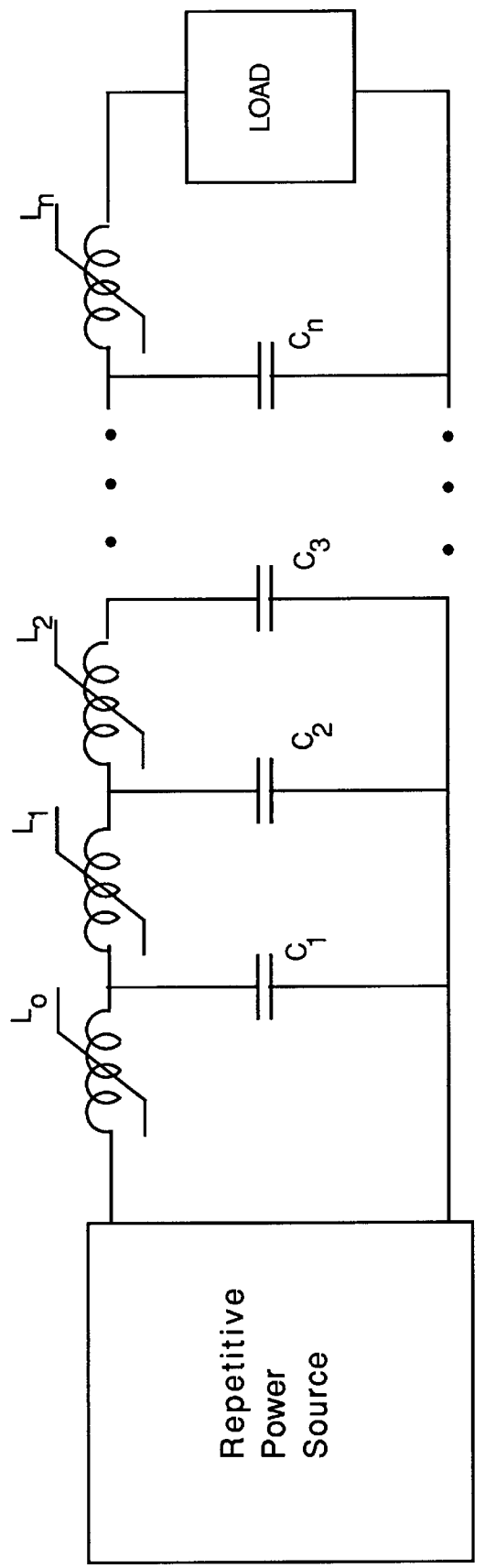
FIG. 1 illustrates a circuit diagram of a typical prior art multiple stage magnetic compression circuit.
Figure 2:
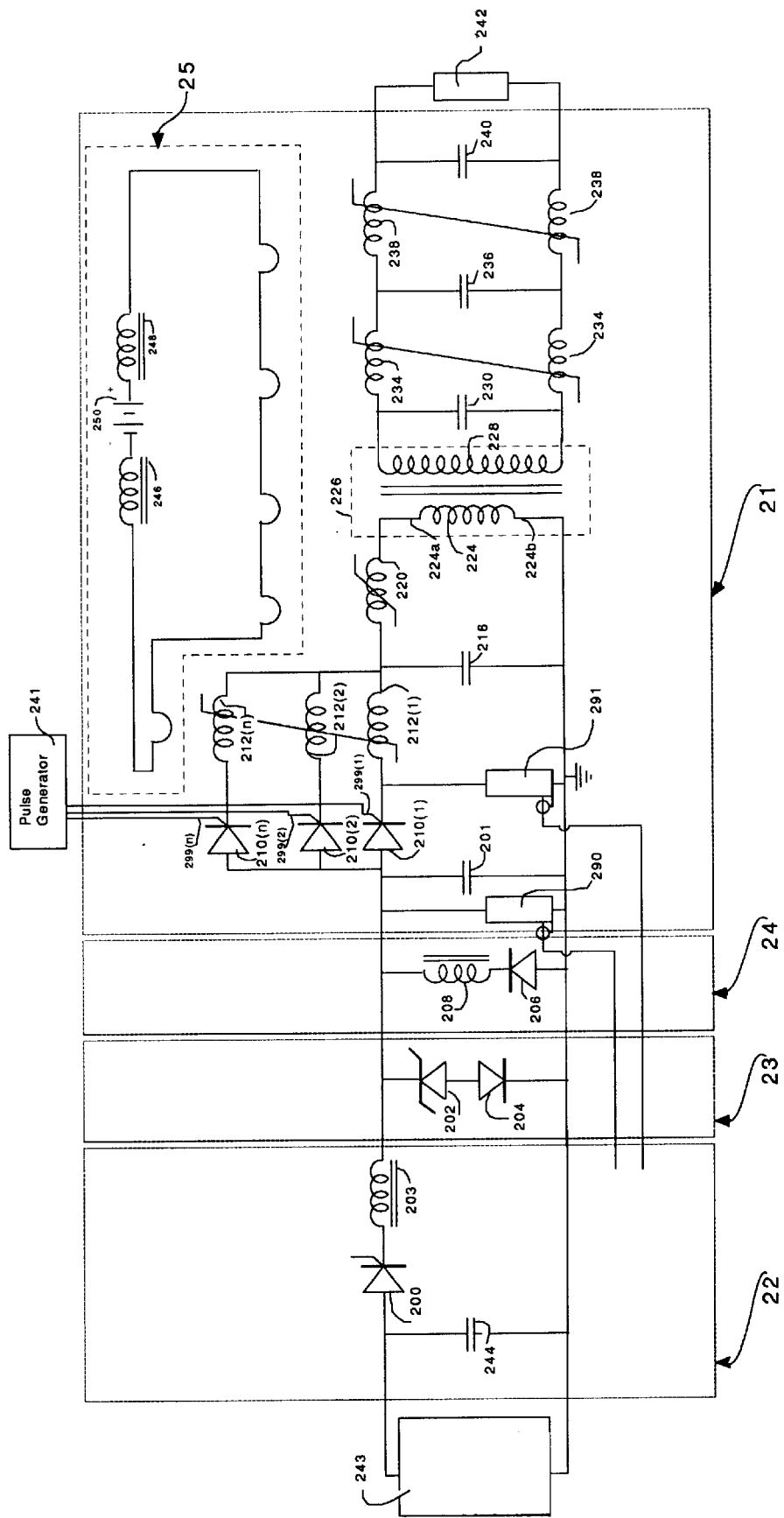
FIG. 2 is a circuit diagram of one embodiment of the present invention.

Referring to the schematic diagram of FIG. 2, a preferred embodiment of the present invention comprises a solid-stage modulator (solid state switched multistage magnetic compression circuit). FIG. 2 depicts a multi-stage magnetic compression circuit 21 having three stages of compression (magnetic switches 220, 234, 238) with a step-up transformer 226 positioned between the first and second stages. The circuit topology could be modified to have additional compression stages if required by the application. FIG. 2 also shows the charge circuit 22, overvoltage protection circuit 23, the energy recovery circuit 24, and the reset/bias circuit 25. Explanations of the operation of these circuits are included below where appropriate.

Magnetic Modulator Operation

The following is a brief outline of how the magnetic modulator operates. The modulator is operated from a source of dc input power (243) capable of providing approximately 110 kW at approximately 550 Vdc which is applied at capacitor $C_{bank}$ (244) which is a capacitor much larger in value than capacitor $C_0$ (201). Between the dc power supply (243) and the modulator there must be a power conditioning circuit which in this embodiment is designated as a command resonant charge (CRC) circuit consisting of $C_{bank}$ (244), a switch (200), and a charge inductor (203). The CRC provides dc isolation between power supply (243) and the modulator and also charges the modulators' intermediate storage capacitor, $C_0$ (201), appropriately. With reference to FIG. 2, the following assumptions will now be made: the CRC circuit has charged capacitor $C_0$ (201) to its operating voltage and has commutated itself off; all magnetic switches are biased to their initial operating point; there are no currents flowing through any component and no voltages appear on any capacitors other than $C_0$ (201). These are normal expectations for proper operation.

A pulse generator (241) provides a trigger pulse to the trigger circuit (not shown) for each of the main SCRs (210(1) through 210(n) and collectively referred to as 210). After a short hold-off time, the magnetic assist (212(1) through 212(n) and collectively referred to as 212) saturates and current starts to flow out of capacitor $C_0$ (201), through the SCRs (210) and the saturated inductance of the magnetic assist (212), and into capacitor $C_1$ (216). Due to the resonant nature of the circuit, the current will be sinusoidal in shape. Capacitors $C_0$ (201) and $C_1$ (216) are of nearly equal value for efficient energy transfer and as $C_0$ discharges, $C_1$ charges in a like manner such that $C_1$ will charge to a voltage very nearly the same as the initial charge voltage on $C_0$ as the current in the circuit approaches zero. The voltage difference is due to energy losses associated with the SCRs (210), the magnetic assist (212) and resistive losses in capacitors and the other conductors.

Ideally, as the voltage on capacitor $C_1$ (216) peaks, the first stage magnetic switch (220) saturates. First stage magnetic switch (220) saturation results in an abrupt change in inductance from a large value to a very small value and results in energy being transferred out of capacitor $C_1$ (216) through the first stage switch (220), and into the primary windings (224) of transformer (226) where it is coupled to the high voltage section of the modulator by the transformer secondary winding (228) and thus charges capacitor $C_2$ (230). It is important to note that inductance values for the magnetic switch circuit are chosen such that energy comes out of capacitor $C_1$ (216) at a faster rate than it was initially charged, i.e., the energy pulse is being compressed in time. The voltage step-up of the transformer is equal to its turns ratio, N, which in a preferred embodiment is eighty. The value of capacitor $C_2$ (230) is very nearly equal to capacitor $C_1$ (216) divided by $N^2$ so the discharge current is again sinusoidal with the voltage peaking on $C_2$ (230) as the current approaches zero.

As the voltage peaks on capacitor $C_2$ (230), the second stage magnetic switch (234) saturates and energy is transferred from capacitor $C_2$ (230) to capacitor $C_3$ (236) in a like manner as before. Third stage magnetic switch (238) saturation at the voltage peak on $C_3$ (236) initiates the energy transfer from capacitor $C_3$ (236) to capacitor $C_{pk}$ (240). The value of $C_{pk}$ (240) is less than $C_3$ (236) because the laser load (242) is electrically in parallel with $C_{pk}$ and a faster risetime and higher voltage is needed by the laser.

To the modulator, the laser represents an underdamped inductive load with a time varying impedance into which it is very difficult to couple energy in an efficient manner. As a result, much of the energy delivered to the laser is not absorbed and manifests itself as an inverse polarity voltage pulse (as compared with the incident voltage) which propagates back towards the modulator input. This energy pulse causes the main SCRs (210) to conduct for a second time as the energy is deposited in capacitor $C_0$ (201) in the form of negative voltage on capacitor $C_0$ (201). The components of the energy recovery circuit (24), inductor (208) and blocking diode (206) reverse the polarity of the voltage on capacitor $C_0$ (201) in preparation for the next CRC circuit charge pulse.

After the voltage pulse is delivered to the laser and prior to the next pulse, the modulator's magnetic components including the magnetic assist must be reset. This task is performed by the reset/bias circuit 25.

This circuit is in essence a current source (constructed as a low voltage dc power supply (250) with large series isolation inductors (246 and 248) connected to each power supply output terminal) which couples to each of the modulator's magnetic cores as a single turn through the core. The direction of the current flow in the reset/bias circuit is opposite to discharge currents generated during pulse generation. In operation, the reset/bias circuit realigns (resets) the magnetic dipoles within each core and then holds (biases) them in that position until the next pulse. In a preferred embodiment, the reset turn is constructed as an aluminum rod passing through the axial center of this cylindrically symmetric magnetic modulator with the isolation inductors attached electrically to the reset rod and physically mounted at either end of the modulator. The following is a detailed description of the operation of the magnetic modulator system.

Command Resonant Charge Circuit (22)

Pulse charging of the modulator's intermediate storage capacitor, $C_0$ (201), at the required repetition rate is performed with a command resonance charge (CRC) circuit comprised of capacitor $C_{bank}$ (244), a gated or triggered closing switch (200), a charge inductor ($L_{chg}$, 203), and as the load, the intermediate storage capacitor $C_0$ (201). CRC circuit operation begins with a trigger pulse to initiate closure of the CRC switch (200) which allows energy to be transferred from capacitor $C_{bank}$ (244) to capacitor $C_0$ (201) through $L_{chg}$ (203) and the CRC switch (200) over a time period of approximately 100 microseconds. In this circuit embodiment, the CRC switch (200) is an SCR; Westcode device #R325CH14. Due to the nature of a resonant charge circuit, a voltage step-up by a factor of approximately 1.6 to 2.0 times the voltage on capacitor $C_{bank}$ (244) (dependent on circuit losses, initial conditions, and capacitor values) is realized on capacitor $C_0$ (201). After $C_0$ is charged, the inverse voltage across the CRC switch (200) commutates the device to an off-state (this takes approximately 40 µs) where it remains off until gated on for the next charge cycle. The value of the intermediate storage capacitor, $C_0$ (201), is approximately 50 microfarads (µF) and can store approximately 25 Joules of energy at a charge voltage of 1000 volts. In the preferred embodiment, capacitor $C_0$ (201) is fabricated as a parallel assembly of 0.1 microfarad capacitors. Each capacitor is fabricated from aluminum film deposited on polypropylene plastic film, a low-loss dielectric material, and must have a dc voltage rating of at least 2000V (Roederstein MKP 1841-410/205 or equivalent are preferred).

Zener Diode Overvoltage Protection Circuit (23)

Under certain operating conditions, in particular, certain types of fault modes (failures not necessarily associated with component failure), it is possible for the CRC circuit to charge the capacitor $C_0$ (201) to a voltage greater than the desired maximum operating level of 1000 V. This voltage also appears across the main SCRs (210) and can exceed the 1200 V rating of these devices. To protect the SCRs (210), a zener overvoltage protection circuit is incorporated. This circuit consists of a stack of power zener diodes represented as (202) and a series inverse blocking diode (204). A stack of zener diodes (202) is required because a single zener diode does not have a sufficient voltage rating. The zener stack (202) is designed to start conducting whenever the voltage on capacitor $C_0$ (201) exceeds approximately 1100 volts thereby shunting any additional charging energy to ground. The series blocking diode (204) prevents current flow through the zener diode stack (202) when the voltage on capacitor $C_0$ (201) is negative with respect to ground. Voltage monitors (290) and (291) monitor the voltage across $C_0$ (201) and the output of SCRs (210) respectively in a conventional fashion.

Diode (204) is a fast recovery device manufactured by Powerex (R6221230) which has blocking voltage rating of 1200 V, a current carrying capacity of 300 amperes average, and a 500 nanosecond recovery time. The zener diodes are marketed by International Rectifier and have a 500 watt power dissipation capability at zener voltages of 100 and 150 volts.

Energy Recovery Circuit (24)

When energy reflected from the load is deposited on capacitor $C_0$ (201), this negative voltage represents an initial condition to the next charge pulse. The peak voltage, $V_{pk}$, to which capacitor $C_0$ (201) will be charged by the CRC circuit is defined by the relation $V_{pk} = K \ast V_{Cbank} - V_{i.c.}$ where K is a loss dependent constant usually between 1.6 and 2.0, $V_{i.c.}$ is the initial voltage on $C_0$, and $V_{Cbank}$ is the voltage on the capacitor $C_{bank}$ (244). An examination of this relation shows that even if the voltage on $C_{bank}$ (244) is well regulated, differences in the reflected voltage on capacitor $C_0$ (201) result in poorly regulated charge voltages on $C_0$; furthermore, a negative voltage on $C_0$ can result in charge voltages that exceed the SCR (210) voltage ratings (see Zener Overvoltage Protection Circuit (23)). Usually, the modulator/laser system behaves in a repeatable manner in that the energy reflected will be the same for the same peak charge voltage on $C_0$ (201); therefore, it is important that the instability cause by the positive feedback of negative voltage on capacitor $C_0$ (201) be eliminated. This is accomplished by the components designated as the energy recovery circuit, the inductor (208) and blocking diode (206). These components allow the energy represented by the negative voltage on $C_0$ (201) to ring within the loop formed by those components and capacitor $C_0$ (201) and to reverse the polarity of the voltage on $C_0$. The energy is not lost or dissipated (except for the small resistive losses) and the instability is eliminated provided that the CRC circuit switch (200) is not gated on until after the $C_0$ (201) voltage reaches zero. Saving the reflected energy stored on capacitor $C_0$ (210) results in increasing the overall modulator efficiency by approximately 15% as compared with conventional modulators. This type of circuit is more easily implemented for low voltage circuits than for high voltage circuits because low voltage (<1200 volt) diodes and inductors can be used and because the inductor is a more easily realizable value (at high voltages, very large inductance values are required to provide sufficient recovery time for the main switch).

Diode (206) is a fast recovery device manufactured by Powerex (R6221230) which has blocking voltage rating of 1200 V, a current carrying capacity of 300 amperes average, and a 500 nanosecond recovery time. The value of the energy recovery inductor (208) is chosen so that the voltage will remain negative on capacitor $C_0$ (201) for approximately 70 microseconds to allow for complete recovery of the main SCRs (210). This requires an inductance of approximately 40 microhenries and, depending on the actual voltage reversal, this inductor (208) needs a current carrying capability of at least 120 amperes RMS. Inductors having these specifications are usually wound on powdered iron cores with either Litz wire or hollow copper tubing (for water cooling).

Components of the 3-Stage Magnetic Modulator
(21) SCR Commutator System

Referring again to FIG. 2, an SCR commutator (210) comprises a plurality of parallel connected gate-controlled SCRs (210(1) through 210(n)). These commutation devices are preferably Westcode type R400CH12 or equivalent. They provide the commutation means for producing the pulses for driving the laser load (242). The deployment of SCRs as commutators in a magnetic pulse compression circuit must be engineered in such a manner that their device ratings can never be exceeded in any conceivable mode. Referring to FIG. 2, preferably seven SCRs (210) are arranged in parallel. Their function is to initiate, in a low loss manner, the transfer of energy out of the intermediate storage capacitor $C_0$ (201) and into capacitor $C_1$ (216) which is the input capacitor to the first stage of the modulator. $C_1$ (216) has a total capacitance of approximately 50 microfarads and is a parallel assembly of low loss capacitors fabricated from aluminum foil and polypropylene plastic film each having a value of 0.1 microfarad and a voltage rating of at least 1600 volts DC (Roederstein KP1836-410/135 or equivalent). In this preferred embodiment, the energy transfer takes approximately 7 microseconds which corresponds to a total peak current of approximately 11,000 amperes shared equally by the SCRs (210) and a peak di/dt through each SCR not to exceed approximately 700 amperes per microsecond. SCRs (210) are turned on by applying a pulse to their gate leads (299(1) through 299(n)) after capacitor $C_0$ (201) has been charged by the CRC circuit.

Figure 3:
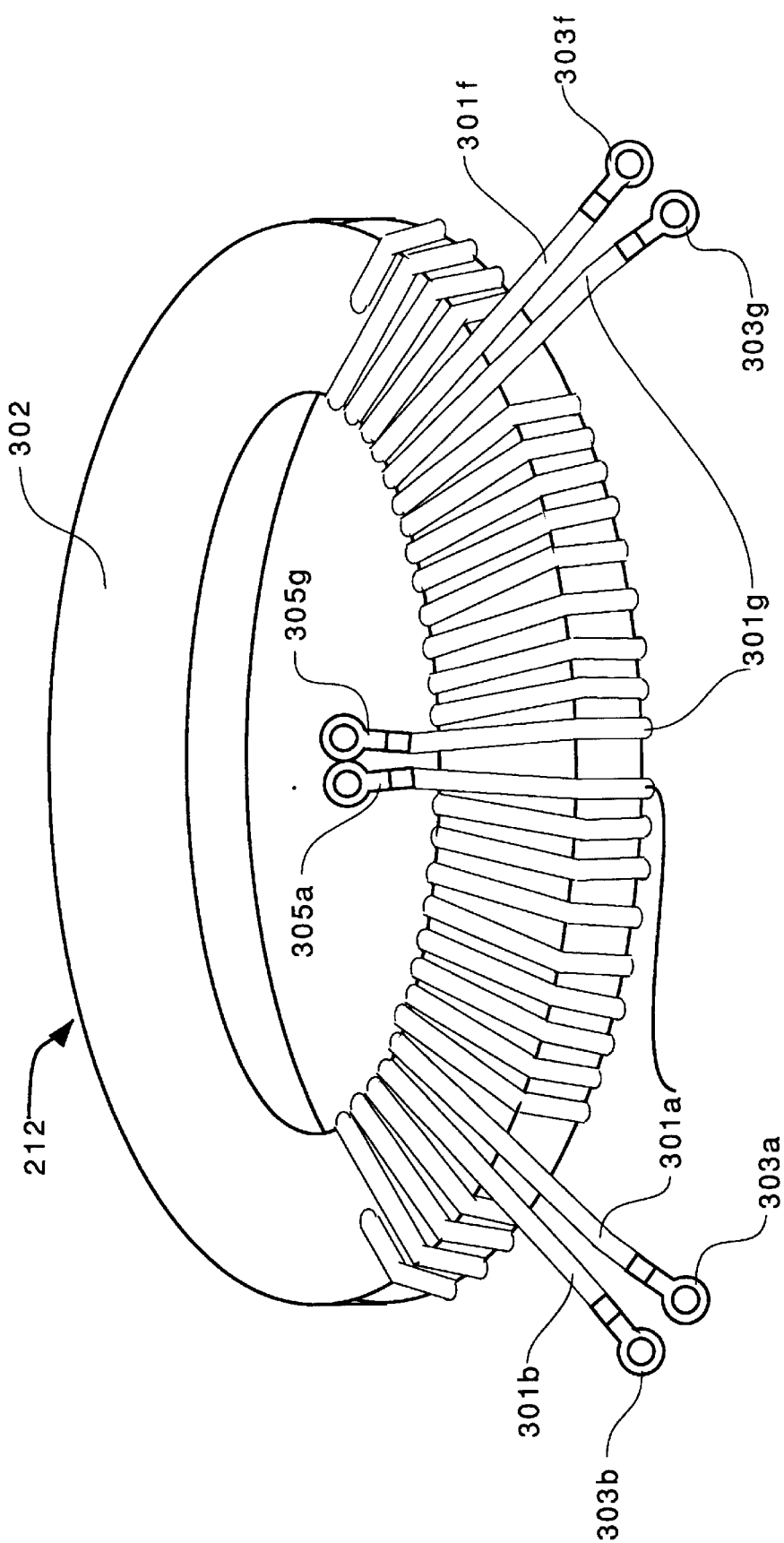
FIG. 3 is a perspective view of the magnetic assist according to the present invention.

Electrically in series with each SCR (210) is connected an inductor which corresponds to a single winding (301a through 301n, collectively referred to as 301 as shown in FIG. 3) on the magnetic assist (212). Mechanically, the magnetic assist (212) is constructed as multiple windings (at least one per SCR) wound upon a ferrite core having toroidal geometry. In the preferred embodiment shown in FIG. 3, 7 windings (301a–301g) (one per SCR (210)) each having 10 turns are made of #10 AWG Litz wire, spaced closely together in a single layer, and distributed around the entire toroidal surface of the ferrite core (302). The ferrite core (302) has the approximate dimensions of 4-inch inside diameter, 6-inch outside diameter, and 0.5-inch thickness. The ferrite material may be any of a number of the NiZn high frequency, high resistivity materials such as TDK type PE11B or Ceramic Magnetics type CMD5005. To reduce the maximum voltage stress between adjacent wires, the input connections (303a through 303g) (which are at the same voltage potential and connected to the SCR cathodes) of adjacent windings originate from outside the toroid and are started side-by-side with opposite winding directions (one clockwise and one counterclockwise) as shown in FIG. 3. This results in the output connections (305a through 305g) (also at the same voltage potential) of adjacent windings terminating side-by-side at positions which are within the toroid inside diameter where they are connected electrically to capacitor $C_1$ (216).

The magnetic assist (212) performs several functions: it reduces the power dissipation within the SCRs (210); it forces current sharing between SCRs (210); and it determines the time required to transfer energy between the capacitors $C_0$ and $C_1$.

Power dissipation within the SCRs can be broken down into three distinct time periods; during turn-on, during its conduction pulse, and during turn-off. Turn-on power losses are associated with the device starting to conduct current while the voltage across the device is falling (power dissipation is the time integral of the product of instantaneous voltage and instantaneous current). To reduce turn-on losses, the first function performed by the magnetic assist (212) is to hold-off current conduction through the SCRs (210) for a finite time (about 1–2 microseconds) after they have been triggered, thereby allowing the voltage across the SCR to collapse completely. When the SCRs (210) are first triggered, the voltage across the SCRs begins to collapse as the device area begins to conduct and this voltage appears across the large inductance of the windings of the unsaturated magnetic assist. The current flowing in the circuit will remain small as long as the magnetic core of the magnetic assist remains unsaturated. Conduction losses are associated with the conducting surface area of the switching device; as the conducting area increases, the device on-resistance decreases and therefore the losses of the device decrease. The larger SCR devices can require 20 microseconds or longer for the entire device area to completely turn-on. The first few microseconds are very important for devices that have short conduction times (less than 10 microseconds) because that time period is when they are most susceptible to exceeding current density limits (usually given in terms of di/dt ratings). The 1–2 microsecond hold-off time, while not enough to allow the SCRs (210) to completely turn on, reduces the current density within the device which in turn reduces conduction losses. Turn-off losses are associated with the amount of energy required to remove the charge from within the device junction after the main conduction pulse and how fast this charge is removed. The hold-off time of the magnetic assist (212) slows down the charge removal rate and thereby reduces SCR turn-off losses. The magnetic assist (212) hold-off time is determined by the magnetic properties of the ferrite core, the core geometry (cross-sectional area), and the number of turns on the windings.

When the magnetic core does saturate, the winding inductance changes to the much smaller value of its equivalent air-core inductance and much larger currents can begin to flow. Because all the windings are wound on the same magnetic core, the SCRs (210) simultaneously respond to the inductance change due to core saturation. Since the windings on the magnetic assist (212) are the same, each SCR sees the same series inductance and therefore shares current equally with the other SCRs.

The third function for the magnetic assist (212) is to determine the time required to transfer energy from capacitor $C_0$ to capacitor $C_1$. It is important that the energy transfer be completed within the time period specified by the volt-seconds of the first stage of compression. The energy transfer time is inversely proportional to the resonant frequency of the CLC tank circuit formed by the loop of $C_0$, L, and $C_1$ where L is the total circuit inductance of the loop. In this embodiment, the saturated inductance of the parallel windings of the magnetic assist, $L_{sat}$, dominates the loop inductance and therefore determines the energy transfer time. $L_{sat}$ is easily determined from standard inductance formulas for toroidal geometries.

The "inputs" of the parallel connected magnetically assisted gate controlled SCRs are electrically connected in FIG. 2 to capacitor 201 while the "outputs" are electrically connected to capacitor 216.

First Stage Switch

Figure 7:
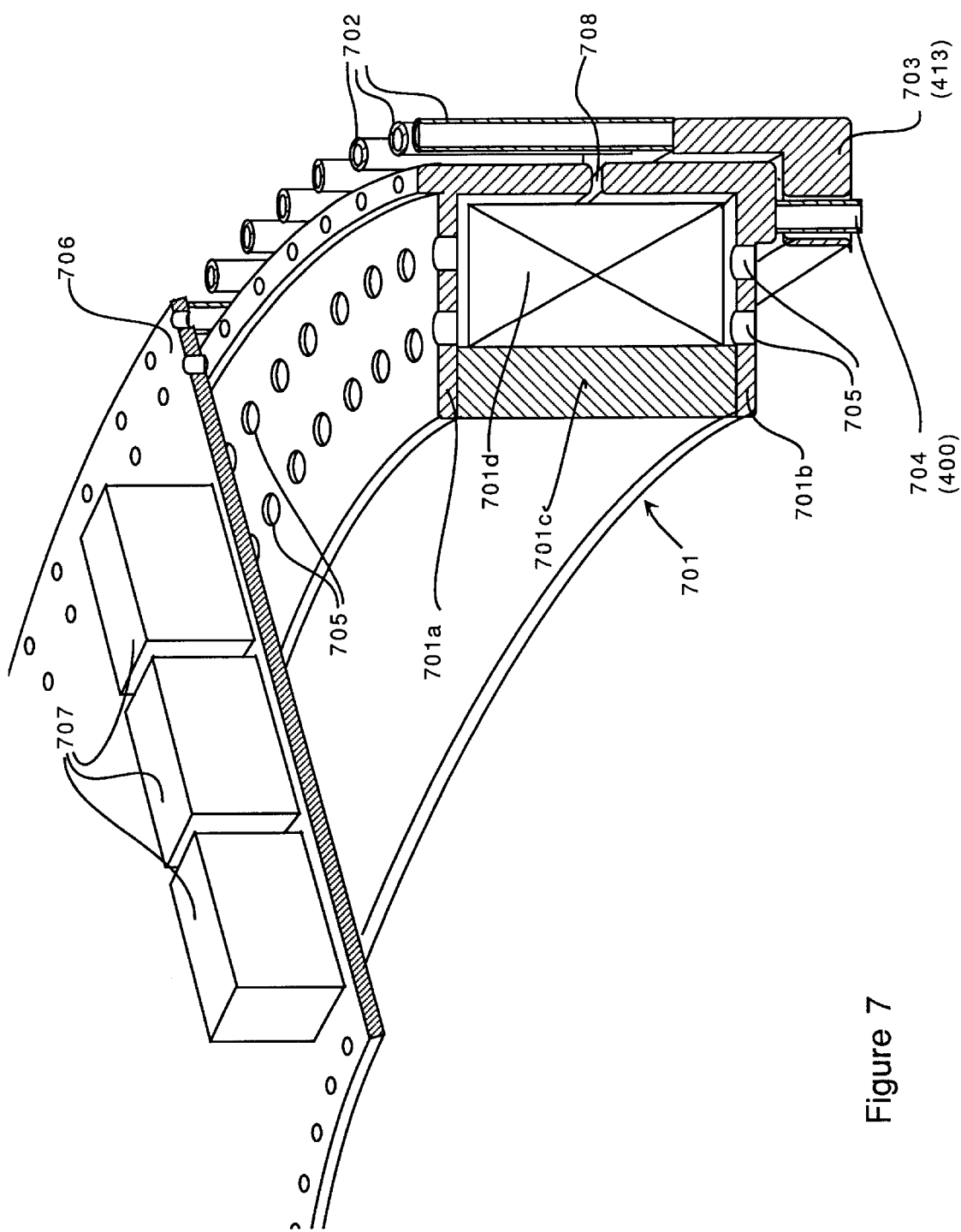
FIG. 7 is a perspective cross-sectional view of the first stage.

The operational requirements for the first stage switch are very stringent. The magnetic switch must have a gain of approximately 10 (~7 microsecond hold-off to ~700 nanosecond transfer time), a very low saturated inductance of less than two nanohenries, low energy losses in the magnetic core and conductors, and the mechanical integrity required to sustain the forces produced by a peak current of greater than 100,000 amperes. These requirements are met by using a magnetic material, Metglas™ 2605SC, in a single-turn coaxial type structure as shown in FIG. 7. The coaxial structure is an assembly consisting of mandrel (701c) on which is wound the magnetic core (701d) and two core covers (701a and 701b). The top core cover (701a) attaches electrically and mechanically to the $C_1$ (216) capacitor board assembly (706) which is an assembly consisting of three layers of four each truncated quarter circle boards on which are loaded 0.1 microfarad Roederstein capacitors (707). The bottom core cover (701b) attaches electrically and mechanically to the primary windings of the fractional turn transformer by 72 each spacers (704 [items 400 in FIG. 4]). The total loop inductance formed by the $C_1$ capacitor board assembly (706), the saturated first switch (701), the transformer primary windings (401–404 in FIG. 4), and the ground return (spacers (702) and the ground ring (703 [item 413 in FIG. 4]) which also connects to the ground return (401e in FIG. 4) of the fraction turn transformer) must be approximately 2.2 nanohenries of which the first stage switch (701) comprises approximately 1.8 nanohenries. Coolant has access to the magnetic core (701d) through holes (705) located in the top and bottom core covers (701a and 701b)and the gap 708 that exists between the core covers (701a and 701b) on the outside diameter of the core.

Fractional Turn Transformer (226)

The fractional turn pulse transformer performs the functions of stepping up the voltage from the approximately 1000 volt level needed by the main-SCRs (210) to the greater than 60,000 volt level required by the laser. The fractional turn transformer described herein is defined to have two or more single-turn transformer primary windings electrically connected in parallel and driven by a single source. In addition, a continuous and electrically isolated secondary winding(s) links electromagnetically to each of the parallel primary windings. The total step-up ratio (1:N) is the algebraic product of the number of primary windings times the number of turns in the secondary winding(s). Associated with the 1:N voltage step-up is the $N^2$ impedance transformation between the very low impedance primary circuit and the higher impedance of the secondary circuit. Additional stages of compression are then needed to reduce the modulator output impedance to more closely match the laser impedance.

The overall modulator efficiency is closely related to the design and performance of the step-up pulse transformer. If the transformer has poor coupling between the primary and the secondary windings, manifested as leakage inductance, the time required to transfer the energy through the transformer increases. This in turn requires higher gain in subsequent stages of compression to achieve the desired risetime on the laser load. Higher gain in magnetic switches requires the use of more magnetic material and consequently higher overall losses.

High step-up ratio pulse transformers generally have a high turns ratio for the secondary winding with respect to the primary winding. Since the leakage inductance is determined by how well the primary and secondary windings are coupled together and to the magnetic core, generally the leakage inductance becomes larger as the turns ratio increases. Conventional efforts to reduce leakage inductance, often involve interleaving the primary and secondary windings. This approach is made more complicated when high voltages are involved since the minimum spacings required between low voltage primary windings and high voltage secondary windings reduce coupling and may make the overall assembly large and bulky.

The fractional turn transformer as described herein reduces the leakage inductance between the primary and secondary windings by the nature of its mechanical construction and its electrical configuration.

Figure 4:
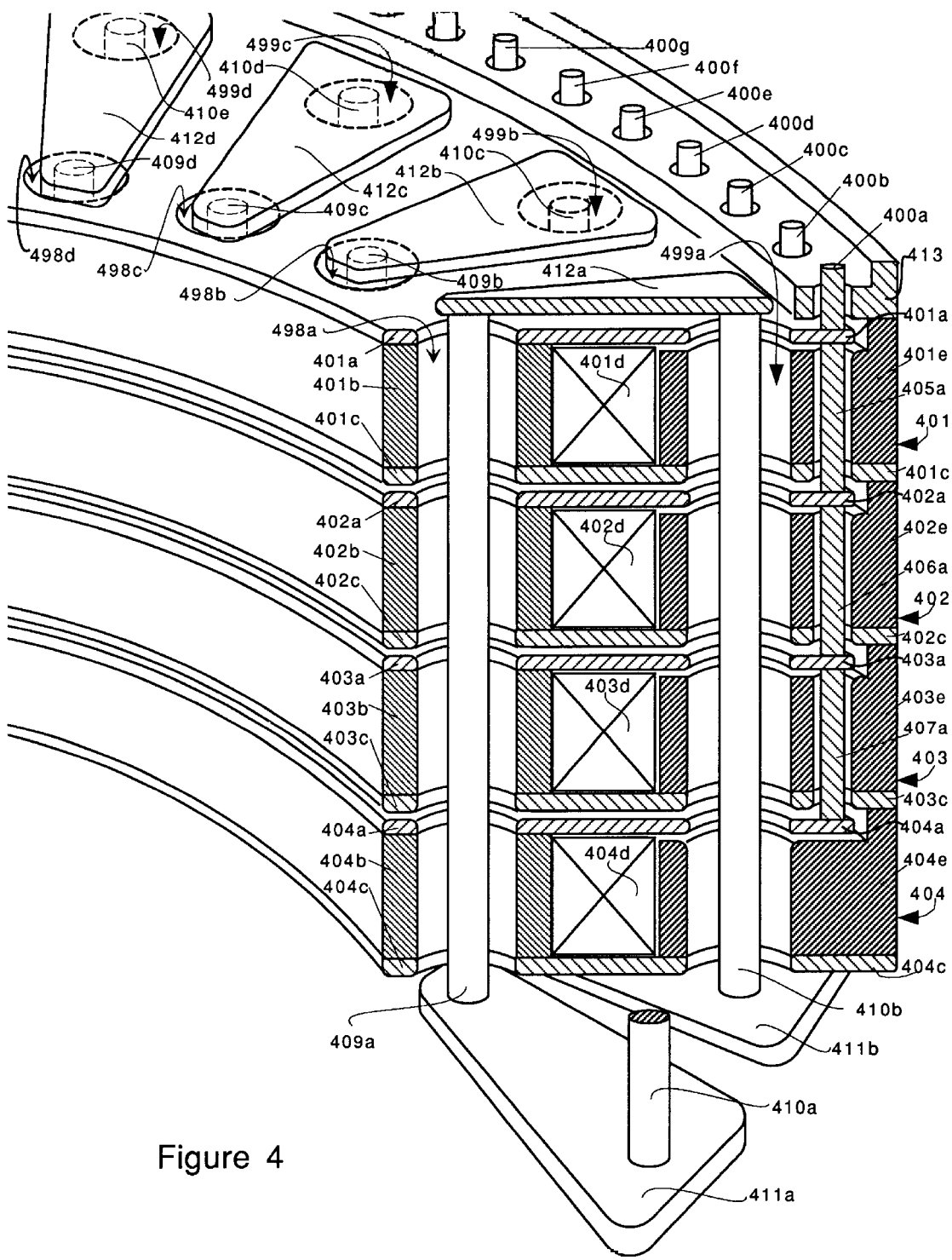
FIG. 4 is a perspective view of a fractional turn transformer according to the present invention.

Mechanically, as shown in FIG. 4 (a perspective cross-sectional view of a fractional turn transformer) the transformer primary windings are constructed of wide electrical conductors which totally enclose a magnetic core which is usually of toroidal geometry. In the preferred embodiment, the toroidally shaped magnetic core (401d, 402d, 403d, 404d) is fabricated from a thin ribbon or tape of magnetic material such the Allied Corporation's Metglas™ which is spirally wound and utilizes a thin plastic film such as polyester or polyimide between adjacent magnetic tape layers to electrically insulate one turn from the other. In this preferred embodiment, a transformer primary winding (401) consists of a pair of plates (401a and 401c)-which attach to the top-side and bottom-side of a mandrel (401b) on which is wound the magnetic core (401d) and a flux shield (401e) which is positioned on the outside diameter of the magnetic core (401d) and which is connected electrically to the bottom plate (401c). The top plate (401a) constitutes the input or drive side of the primary winding (401) and the return side of the primary winding, usually at ground potential, consists of the bottom plate (401c) and the flux shield (401e). A primary winding (401) forms a tightly coupled, conducting loop around the magnetic core in that the plates, mandrel, and flux shield completely surround the core with small spacings on all sides. However, the input and return side of the primary winding must not touch. The plurality of transformer primary windings (401–404) are stacked vertically on their common axis. Electrical connections to both the drive plates and the returns of the primary windings are made in a very low inductance manner such that all of the primary windings may be considered to be driven equally by the drive source. The connections between the first stage and the drive plates of the primary windings of the transformer are comprised of a plurality of electrically parallel rods (400a, 400b, . . . in FIG. 4, collectively referred to as 400) positioned around and electrically connected to the outer portion of the drive plate (401a). A plurality of electrically parallel rods (405a, 405b, . . . , 406a, 406b, . . . , 407a, 407b, . . . , collectively referred to as 405, 406, and 407, respectively) between the drive plates of adjacent primary windings (401, 402, 403, and 404) electrically tie the input plates (401a, 402a, 403a, and 404a) together in a very low inductance manner such that all the input plates may be considered to be driven equally by the drive source. In the preferred embodiment, the parallel rods (72 each for 400, 405, 406, and 407) connecting the transformer drive plates go through apertures in the bottom plates and the flux shields of each transformer primary winding (401–404). The bottom plates (401c, 402c, 403c, and 404c) and flux shields (401e, 402e, 403e, and 404e) of the transformer primary windings must also be connected together in a very low inductance manner for the total transformer primary circuit to have low leakage inductance. As depicted in FIG. 4, this is achieved by connecting the flux shields (401e–404e) to the bottom plates (401c–404c). In this embodiment, this means that a low resistance, low inductance electrical connection exists between 401e, 401c, 402e, 402c, 403e, 403c, 404e, and 404c).

The secondary winding of the transformer is comprised of a plurality of stainless steel tubes (409a, 409b, . . . , collectively referred to as 409) installed on a diameter smaller than that of the magnetic core (401d–404d) and connected on each end with a bus link (411a, 411b, . . . , and 412a, 412b, . . . , collectively referred to as 411 and 412, respectively) to adjacent stainless steel tubes (410a, 410b, . . . , collectively referred to as 410) installed on a diameter larger than that of the magnetic core (401d–404d). The stainless steel tubes extend vertically through the plurality of stacked primaries (401–404). The tubes positioned on the smaller diameter and larger diameter are connected together so that they form a single electrically continuous winding which loops around the magnetic cores of all four primary windings. To maintain the tight coupling to the primary winding in order to achieve low leakage inductance, the tubes of the secondary winding pass through holes (498a, 498b, . . . , and 499a, 499b, . . . , collectively referred to as 498 and 499 respectively) in the transformer mandrels (401b–404b), the drive and bottom plates (401a–404a and 401c–404c) and the flux shields (401e–404e) and are therefore completely insulated from the primary windings. The secondary output voltage appears across the ends of the secondary winding. In this preferred embodiment, a twenty turn secondary winding (a turn is defined as a conductor looping through the inside diameter of a magnetic core) couples to four parallel primary windings (401–404) to achieve a total step-up ratio of 1/4:20 which is equivalent to a 1:80 turns ratio. In operation, 1kV applied to the primary windings (401–404) imparts 4 kV onto each tube (409) as it goes through the v inside diameter of the magnetic cores (401d–404d). In the preferred embodiment, the secondary winding is not electrically connected to the primary winding at any point and the two ends of the secondary winding therefore provide essentially equal but opposite polarity (bipolar) output voltages due to capacitive coupling to the primary winding which is essentially at ground potential.

This geometry provides a significant advantage over the prior art. Prior art fractional turn transformers are wound with wire, and, with wire, it is not possible to attain sub-microsecond pulse risetimes with the compact geometry and close tolerances achieved in this modulator for operation at these power levels and voltages. The fractional turn transformer of the present invention is not limited to the specific configuration described, but rather can incorporate any convenient number of fractional turns in the primary and a corresponding number of multiple turn windings in the secondary in order to achieve the necessary step-up at high frequency. In addition, multiple electrically separate secondary windings can be used to achieve multiple values of output voltages.

Most of the machined hardware used in the transformer (the plates, mandrel, flux shield, bus links, and connection rods) are manufactured from aluminum. Since bare aluminum oxidizes quickly to form an electrically insulating compound, aluminum oxide, all parts are treated with a chemical process, Alodine per MIL-C-5541 Class-3, Yellow. This process makes the aluminum surface electrically conducting and resistant to corrosion. For machined parts, it will be appreciated that the close tolerances that are necessary can, in fact, be achieved and maintained. This applies to the gap spacing between the input plates (401a–404a) and flux shields (401e–404e) as well as the centering of the drive connections (400, 405, 406, and 407) and secondary turns (409 and 410) within their respective apertures in the transformer primary windings. The close spacing of the primary windings (401) and the magnetic core (401d–404d) is easily maintained, and this is of particular importance since the entire modulator is designed to be immersed in a liquid coolant/dielectric and unrestricted liquid flow around the magnetic cores is essential for cooling purposes.

Output Stages of Magnetic Compression

The voltage risetime of the transformer's output at approximately 700 ns is too slow to properly drive the laser. In this modulator two stages are required to perform the pulse compression down to the 40–60 nanoseconds required by the laser. The construction of these two stages of compression is somewhat unique in that each leg of the bipolar output requires electrically isolated and separate saturable inductors. In addition, simultaneous saturation of these magnetic switches is necessary in order to obtain the very low jitter required by the laser system. For both the second and third stages these two requirements are met by having two separate windings wound about the same magnetic core as shown schematically in FIG. 2. Tight coupling to the magnetic core is a requirement for all magnetic switches in order to use the least amount of magnetic material and get the highest modulator efficiency.

Figure 5A:
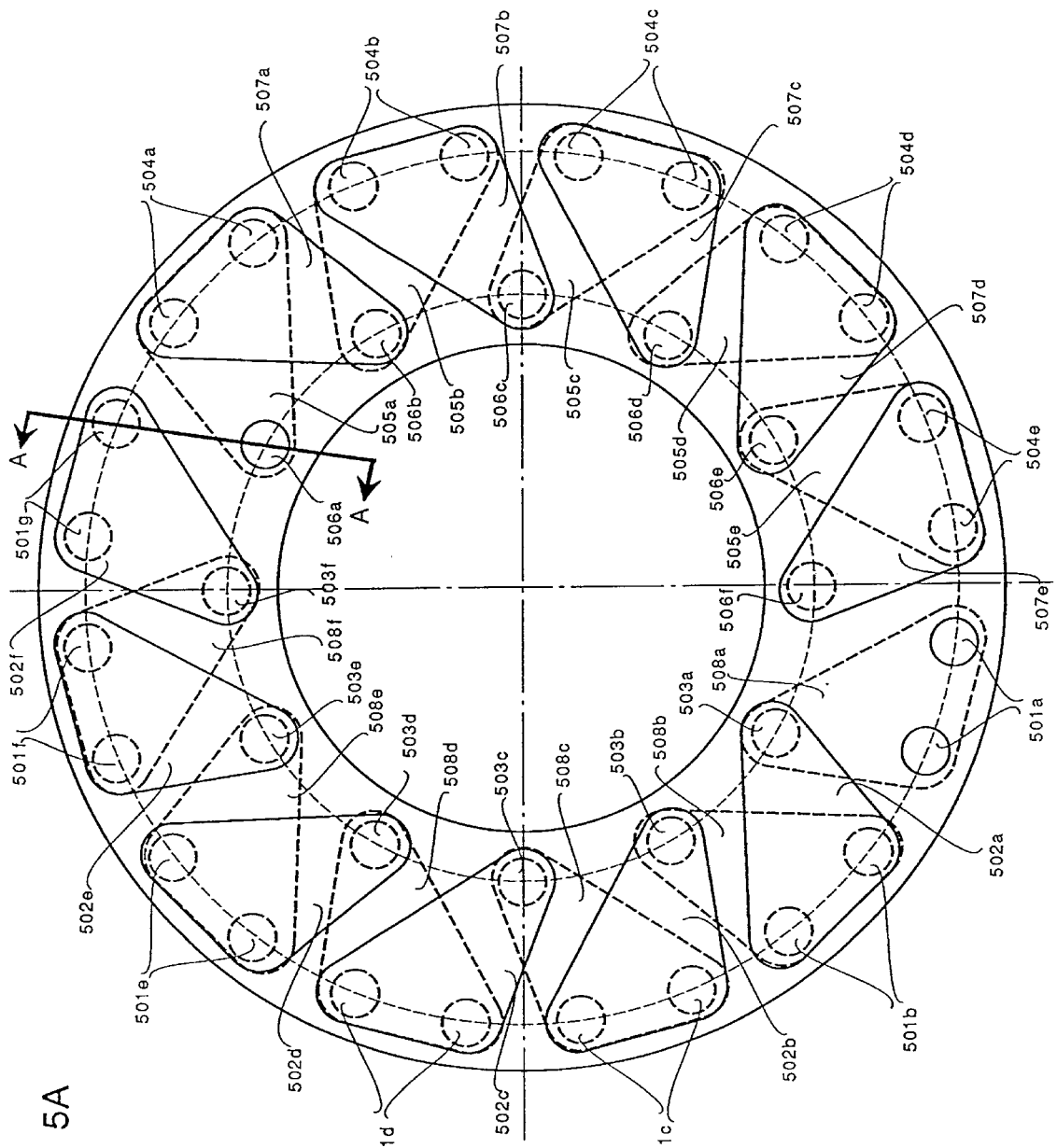
FIG. 5a is a top view of the second stage.
Figure 5B:
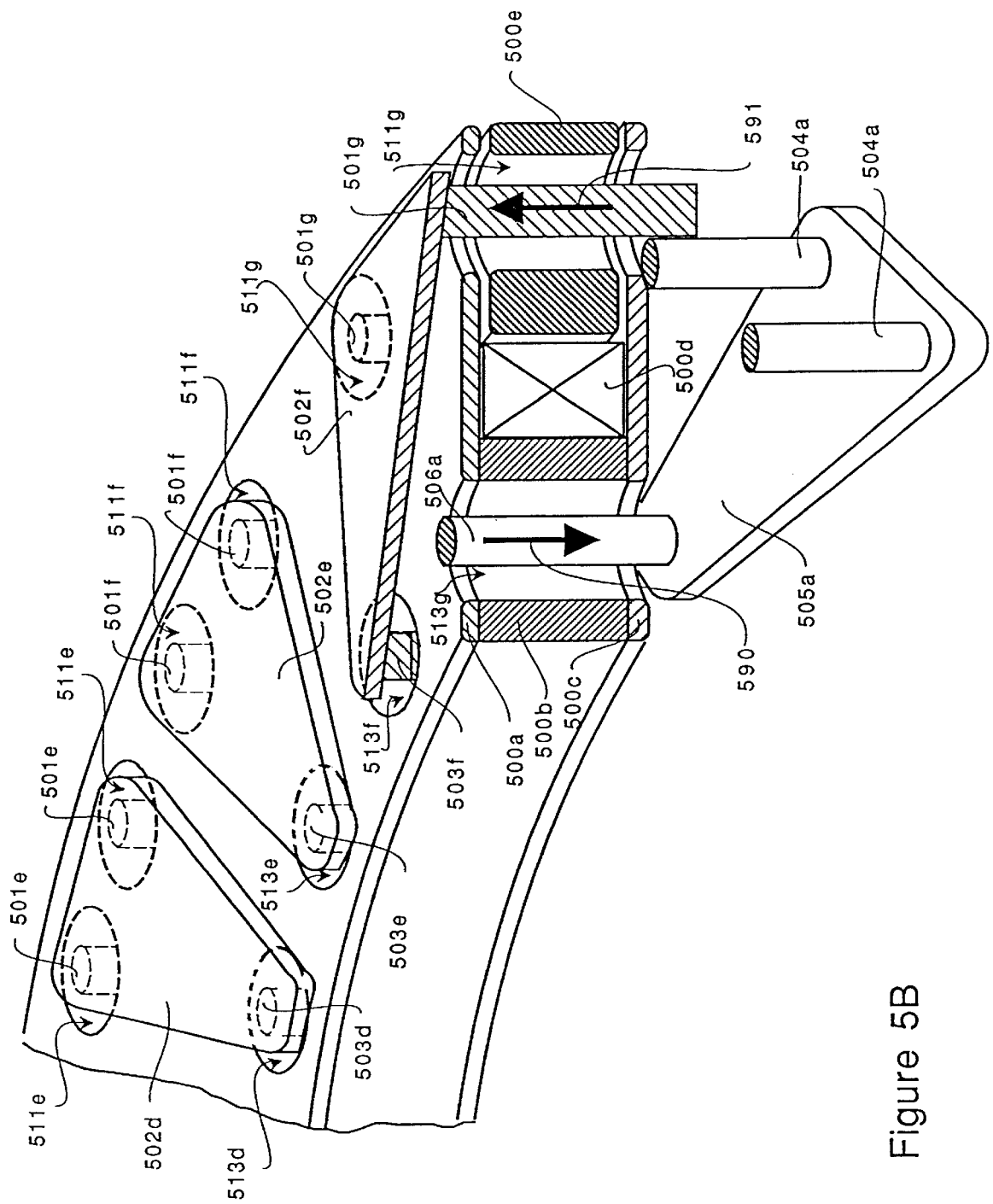

FIG. 5A is a top view of the second stage switch (234) of the magnetic pulse compressor. FIG. 5B is a perspective cross-section taken along line A—A of FIG. 5A. As depicted in FIGS. 5A and 5B, the second stage magnetic core (500d), wound with Metglas™ 2605SC and Kapton™ dielectric film, is surrounded by a gapped aluminum box very similar in construction to a primary winding of the fractional turn transformer, and, like the secondary turns of the transformer, the two 6 turn windings (501a–501g, 503a–503f, and 506a–506f, 504a–504e) of the second stage go through orifices (511a–511g, 513a–513f, and similar orifices (not shown), respectively) in the top and bottom core cover (500a and 500c), flux shield (500e) and mandrel (500b). The flux shield (500e) is attached electrically to either the top or bottom core cover (500a or 500c). As with the first stage core, small (~0.250" diameter) holes (not shown) are placed in the top and bottom core covers (500a and 500b) to allow coolant access to the magnetic core (500d). Additional coolant flow to the magnetic core (500d) is allowed by the gaps between the flux shield (500e) and the core covers (500a and 500c). The input connections (506a and 501a) to the two windings (506 and 501) are the positive and negative polarity outputs, respectively, of the fractional turn transformer (226) across which is also connected capacitor $C_2$ (230) schematically shown in FIG. 2. The $C_2$ capacitor (230) is comprised of 27 parallel sets of 2 each TDK UHV10A (560 pF at 50 kV) capacitors in series or 15 parallel sets of 2 each TDK UNV11A (1000 pF at 50 kV) capacitors in series. As depicted in FIG. 5A, the windings are configured such that the negative polarity winding (consisting of the input connection (501a) at the top, bus links (502a–f [on the top side] and 508a–f [on the bottom side]), connection rods (501b–f and 503a–f), and output connection (501g) at the bottom) proceeds in a clockwise direction from the input to the output. The positive polarity winding (consisting of the input connection (506a) at the top, bus links (507a–e [on the top side] and 505a–e (on the bottom side)), connection rods (504a–e and 506b–e), and the output connection (506f) at the bottom) also proceeds in a clockwise direction from input to output. Upon core (500d) saturation, current flows in each winding such that they generate flux in the same direction within the core. Direction of current flow is shown by arrows (590 and 591) in FIG. 5B.

Figure 6:
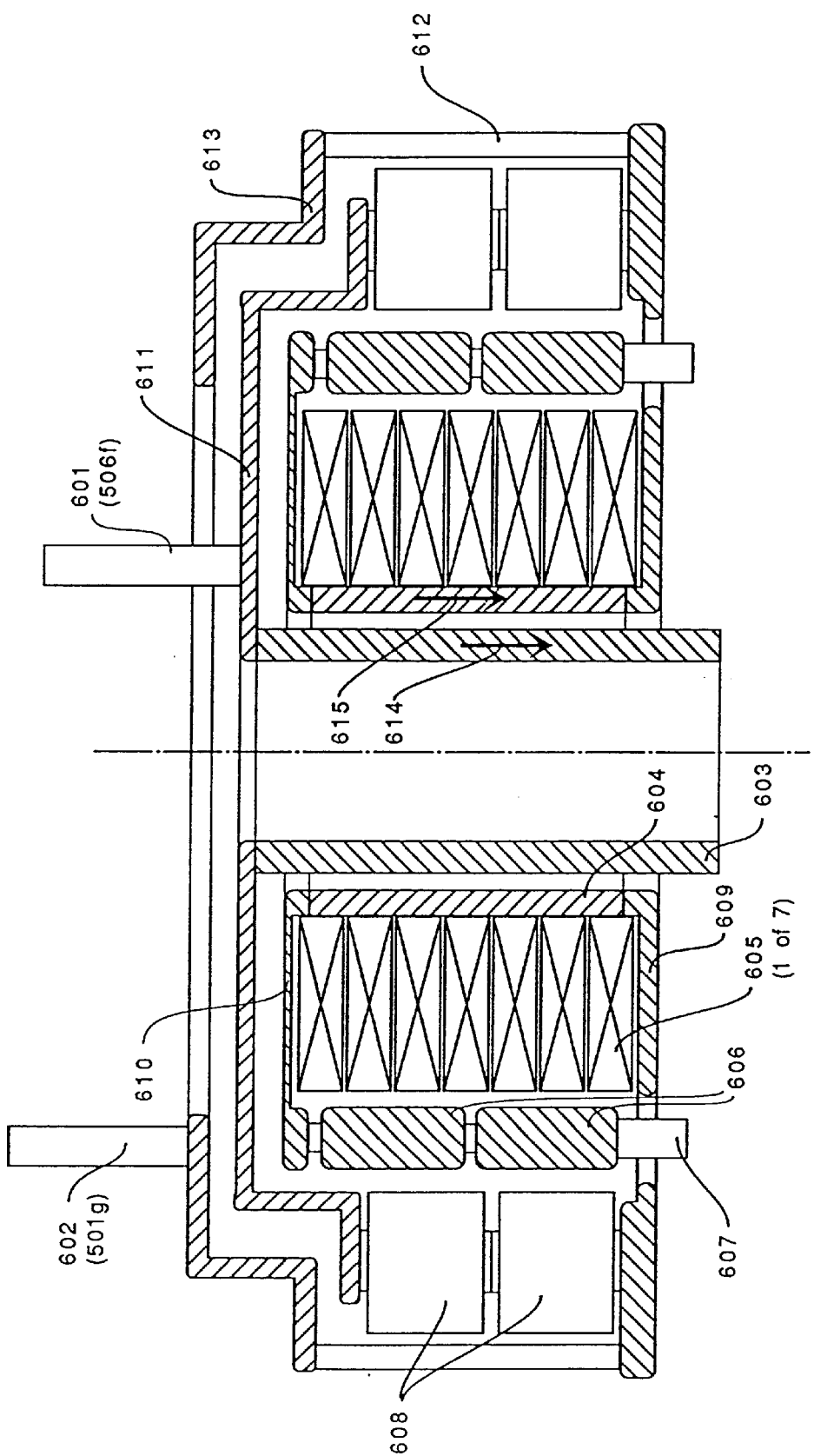
FIG. 6 is a cross-sectional view of the third stage.

The third stage switch (238) is a two turn switch which uses ferrite toroids for the magnetic material. As shown schematically in FIG. 2 and pictorially in FIG. 6, a cross-section of the second stage, capacitor $C_3$ (236, 608) is connected across the positive and negative polarity output connections (506f and 501g, respectively) of the second stage as well as to the positive and negative polarity input of each winding (601 and 602, respectively) of the third stage. The negative polarity connection (602) electrically connects to capacitor $C_3$ (236) by means of the input connection plate (613) and 72 each rods (612) arranged concentrically around the center line. The positive and negative polarity output of each winding of the third stage (603 and 607, respectively) connects electrically to the peaking capacitor (240) and the laser (242). The positive polarity turn consists of the capacitor connection plate (611) and the tube (603). The negative polarity winding consists of the bottom core cover/capacitor connection plate (609), the mandrel (604), the top core cover (610), the flux shields (606), and the output connections (607a–l, collectively known as 607). The flux shields (606) are constructed as toroidal rings mounted just outside the outside diameter of the ferrite cores (605) and are electrically connected to the core cover (610), each other, and the output connections (607). The $C_3$ capacitors ((608)[~7.8 nF or 28 parallel sets of 2 each TDK capacitors [UNV10A—560 pF at 50 kV]]) are arranged in a cylindrical pattern concentric to the ferrite toroids (605). Coolant access to the ferrite cores is provided by gaps between the flux shields (606) and by parallel slots milled axially into the mandrel (604). In addition, small (~0.030–0.060 thick) spacers are placed between the ferrite toroids (605) to provide coolant access. As with the second stage, current flow as indicated by arrows (614 and 615) through the positive and negative polarity windings generate flux in the same direction within the ferrite cores. Since each winding of the third stage consists of a single turn, the conductors through the ferrite cores (605) are most easily fabricated as concentrically counted tubes (603 and 604). This also gives the lowest inductance geometry for the switch.

Accordingly, we have shown and described an improved magnetic modulator for a metal vapor laser which exhibits long life at high voltages, high average powers, and high repetition rates. The foregoing description of preferred embodiments of the invention is presented for purposes of illustration and description. It is not intended to be exhaustive or to limit the invention to the precise form disclosed, and many modifications and variations will become apparent to those of skill in the art in light of the above teachings. For example, the present invention can be easily utilized with thyratron or solid state means for generating the first series of electrical pulses. The present invention is a magnetic compression laser driving circuit having applications to metal vapor lasers such as copper vapor lasers, as well as rare gas lasers and other lasers utilizing a high voltage pulsed electrical discharge. Also, the-present invention will have applications to any load which requires a high voltage driving pulse.

The preferred embodiments described herein were chosen and described in order to best explain the principles of the invention and its practical application so as to thereby enable others skilled in the art to best utilize the invention in various embodiments and with various modifications as are suited to particular uses which may be contemplated. It is intended that the scope of the invention be defined by the claims appended hereto.

What is claimed is:

1. A solid state modulator for powering a pulsed electrical discharge comprising:
   a direct current power supply;
   a first capacitor bank, said direct current power supply electrically connected to said first capacitor bank;
   a second capacitor bank;
   a plurality of parallel-connected magnetically assisted gate controlled SCRs having inputs, outputs and gates, said inputs electrically connected to said first capacitor bank, said outputs electrically connected to said second capacitor bank, and said gates electrically connected to a pulse generator;
   a first stage magnetic compression switch having a first stage switch input and a first stage switch output;
   a fractional turn step-up transformer having a primary and a secondary, said first stage switch input electrically connected to said second capacitor bank, said first stage switch output electrically connected to said primary.

2. The apparatus of claim 1 further comprising:
   a second stage magnetic compression switch having a second stage switch input and a second stage switch output, said second stage switch input electrically connected to said secondary.

3. The apparatus of claim 2 further comprising:
   a third stage magnetic compression switch having a third stage switch input and a third stage switch output, said third stage switch input electrically connected to said second stage switch output and said third stage switch output adapted to be electrically connected to the electrical discharge.

4. The apparatus of claim 3 further comprising a command resonant charge circuit electrically connected to said power supply.

5. The apparatus of claim 4 wherein said command resonant charge circuit comprises:
   a third capacitor storage bank;
   a gate-controlled switch electrically connected to said third capacitor bank; and
   an inductor electrically connected to said gate-controlled switch.

6. The apparatus of claim 5 further comprising:
   a zener diode over-voltage protection circuit electrically connected across said command resonant charge circuit.

7. The apparatus of claim 6 wherein said zener diode over-voltage protection circuit comprises at least one power zener diode and at least one series blocking diode.

8. The apparatus of claim 7 further comprising:
   an energy recovery circuit, electrically connected to said command resonant charge circuit, having an inductor and a series-connected blocking diode.

9. A solid state modulator for a metal vapor laser comprising:
   a direct current power supply;
   a command resonant charge circuit, electrically connected to said direct current power supply, which includes a first capacitor storage bank, a gate-controlled switch electrically connected to said first capacitor bank, and an inductor electrically connected to said gate-controlled switch;
   a zener diode over-voltage protection circuit, electrically connected across said command resonant charge circuit, including at least one power zener diode and at least one series blocking diode;
   an energy recovery circuit, electrically connected across said command resonant charge circuit, including an inductor and a series-connected blocking diode;
   a second capacitor bank, electrically connected to said command resonant charge circuit;
   a third capacitor bank;
   a plurality of parallel-connected magnetically assisted gate-controlled SCRs each having an input, an output and a gate, said inputs electrically connected to said second capacitor bank, said outputs electrically connected to said third capacitor bank, and said gates electrically connected to a pulse generator;
   a first stage magnetic compression switch having a first stage switch input and a first stage switch output;
   a fractional turn step-up transformer having a primary and a secondary, said first stage switch input electrically connected to said third input or bank, said first stage switch output electrically connected to said primary.

10. The apparatus of claim 9 further comprising:

a second stage magnetic compression switch having a second stage switch input and a second stage switch output, said second stage switch input electrically connected to said secondary.

11. The apparatus of claim 10 further comprising:

a third stage magnetic compression switch having a third stage switch input and a third stage switch output, said third stage switch input electrically connected to said second stage switch output.

\* \* \* \* \*